(12) United States Patent
Bernstein et al.

(10) Patent No.: US 7,480,760 B2
(45) Date of Patent: Jan. 20, 2009

(54) ROTATIONAL USE OF MEMORY TO MINIMIZE WRITE CYCLES

(75) Inventors: Sacha Bernstein, Atlanta, GA (US); Anthony L. Gelsomini, Buford, GA (US)

(73) Assignee: Wegener Communications, Inc., Duluth, GA (US)

( * ) Notice: Subject to any disclaimer, the term of this patent is extended or adjusted under 35 U.S.C. 154(b) by 360 days.

(21) Appl. No.: 10/738,506

(22) Filed: Dec. 17, 2003

(65) Prior Publication Data

US 2005/0138271 A1  Jun. 23, 2005

(51) Int. Cl.
G11C 11/34 (2006.01)
G11C 16/34 (2006.01)
G06F 12/16 (2006.01)

(52) U.S. Cl. .................. 711/103; 711/156; 365/185.09; 365/185.33

(58) Field of Classification Search ................. 711/103; 365/185.09
See application file for complete search history.

(56) References Cited

U.S. PATENT DOCUMENTS

| | | | |
|---|---|---|---|
| 5,341,339 A | | 8/1994 | Wells |
| 5,479,638 A | * | 12/1995 | Assar et al. ................ 711/103 |
| 5,485,595 A | | 1/1996 | Assar et al. |
| 5,530,827 A | | 6/1996 | Matsui et al. |
| 5,644,539 A | | 7/1997 | Yamagama et al. |
| 5,835,935 A | | 11/1998 | Estakhri et al. |
| 5,983,312 A | | 11/1999 | Komatsu et al. |
| 6,405,279 B1 | | 6/2002 | Kondo et al. |
| 6,412,080 B1 | * | 6/2002 | Fleming et al. ............ 714/15 |
| 6,615,318 B2 | | 9/2003 | Jarvis et al. |
| 6,621,746 B1 | | 9/2003 | Aasheim et al. |
| 2003/0041210 A1 | | 2/2003 | Keays |
| 2003/0135688 A1 | | 7/2003 | Tai et al. |
| 2003/0149843 A1 | | 8/2003 | Jarvis et al. |
| 2003/0204665 A1 | | 10/2003 | Jain et al. |

FOREIGN PATENT DOCUMENTS

| | | |
|---|---|---|
| GB | 2 305 272 A | 2/1997 |
| WO | WO 95/10083 | 4/1995 |
| WO | WO 97/10604 | 3/1997 |

\* cited by examiner

*Primary Examiner*—Sanjiv Shah
*Assistant Examiner*—Jesse Diller
(74) *Attorney, Agent, or Firm*—Robert C. Haldiman; Husch Blackwell Sanders LLP

(57) ABSTRACT

A system and method to minimize the number of erase cycles performed on a flash memory device to extend its useful life. A flash memory device has several areas where data is stored. Each area is referred to as a block. Memory usage is rotated between blocks to evenly distribute erase cycles.

20 Claims, 7 Drawing Sheets

ROTATIONAL USE OF MEMORY TO MINIMIZE WRITE CYCLES

CROSS-REFERENCE TO RELATED APPLICATIONS

None.

STATEMENT REGARDING FEDERALLY SPONSORED RESEARCH OR DEVELOPMENT

Not Applicable.

APPENDIX

Not Applicable.

BACKGROUND OF THE INVENTION

1. Field of the Invention

This invention relates generally to flash memory devices and, more particularly, to a method of rotating usage of memory partitions to extend the life of the flash memory device.

2. Related Art

Flash memory is a single transistor cell which is programmable through hot electron injection or source injection and erasable through Fowler-Nordheim tunneling. The programming and erasing of such a memory cell requires current to pass through the dielectric surrounding a floating gate electrode. Because of this, such types of memory have a finite number of erase-write cycles. Eventually, the dielectric will fail. Manufacturers of flash cell devices specify the limit for the number of erase-write cycles as between 10,000 and 100,000. Some flash technologies have over-erase problems, therefore they need to be programmed before erasing to improve uniformity. They also have to be verified for successful erase. Accordingly, unlike rotating magnetic media, a flash memory device does not have an indefinite lifetime.

Flash memory devices have many advantages for a large number of applications. These advantages include their nonvolatility, speed, ease of erasure and reprogramming, small physical size and related factors. There are no mechanical moving parts and as a result such systems are not subject to failures of the type most often encountered with hard disk storage systems.

Flash memory devices have many characteristics that are different from other memory devices. One major difference is that a block containing existing data in flash memory devices cannot be overwritten with new data. Existing data must be completely erased (also referred to as "cleaned") from a block before data can be written into memory locations again. For the reasons noted above, blocks can be erased only a limited number of times before the flash memory device becomes unusable.

Additionally, most block erasures stall other operations from occurring such as read and write operations to the flash memory device. Most flash memory systems attempt, therefore, to minimize erasures to specific times, such as at initialization or powering-off of a computer system, or at periodically scheduled times.

SUMMARY OF THE INVENTION

It is in view of the above problems that the present invention was developed. The invention is a data structure, system and method to minimize the number of erase cycles performed on a flash memory device to extend its useful life. A flash memory device has several areas where data is stored. Each area is referred to as a block. Memory usage is rotated between blocks to evenly distribute erase cycles.

In one aspect of the invention, there are two blocks. Data is stored in the first block until it becomes full. When the first block is full, the memory storage area is rotated to the second block. Data is stored in the second until it becomes full. The first block is erased and the process repeats.

In another aspect of the invention, data is stored in a memory area consecutively, much like one would write in a journal. Each memory area is similar to a page and data is stored on the page much like a journal entry. A flash driver directs data to be written on the page until that page is full. When the current page is full, the flash driver directs data to a subsequent page.

In yet another aspect of the invention, there is a dual-function node header. The node header stores information which may be used to identify a valid record. The node header also stores information regarding status of a particular block. For example, the node header can indicate whether the particular block is full, partially written to, or erased. The node header eliminates the need for a look-up table as found in the prior art.

Further features and advantages of the present invention, as well as the structure and operation of various embodiments of the present invention, are described in detail below with reference to the accompanying drawings.

BRIEF DESCRIPTION OF THE DRAWINGS

The accompanying drawings, which are incorporated in and form a part of the specification, illustrate the embodiments of the present invention and together with the description, serve to explain the principles of the invention. In the drawings.

DETAILED DESCRIPTION OF THE PREFERRED EMBODIMENTS

Figure 1:
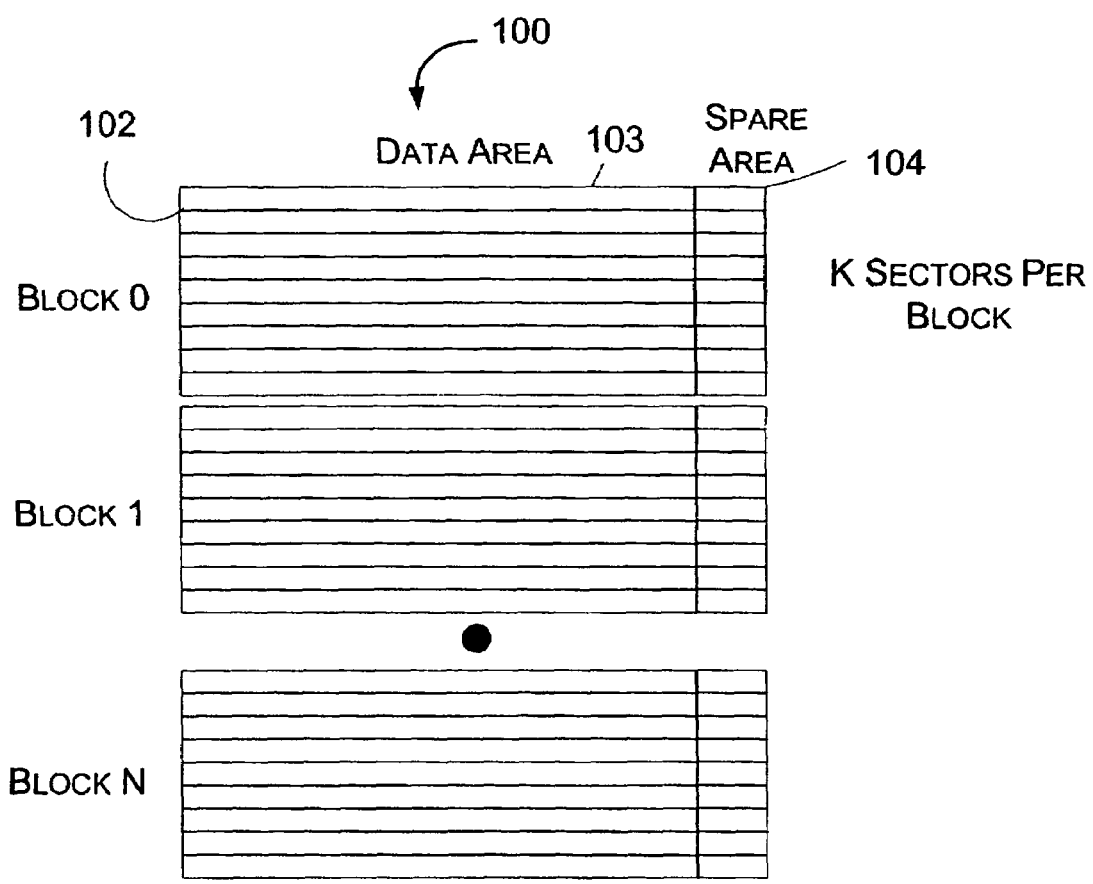
FIG. 1 is a schematic diagram illustrating a NAND flash memory medium.
Figure 2:
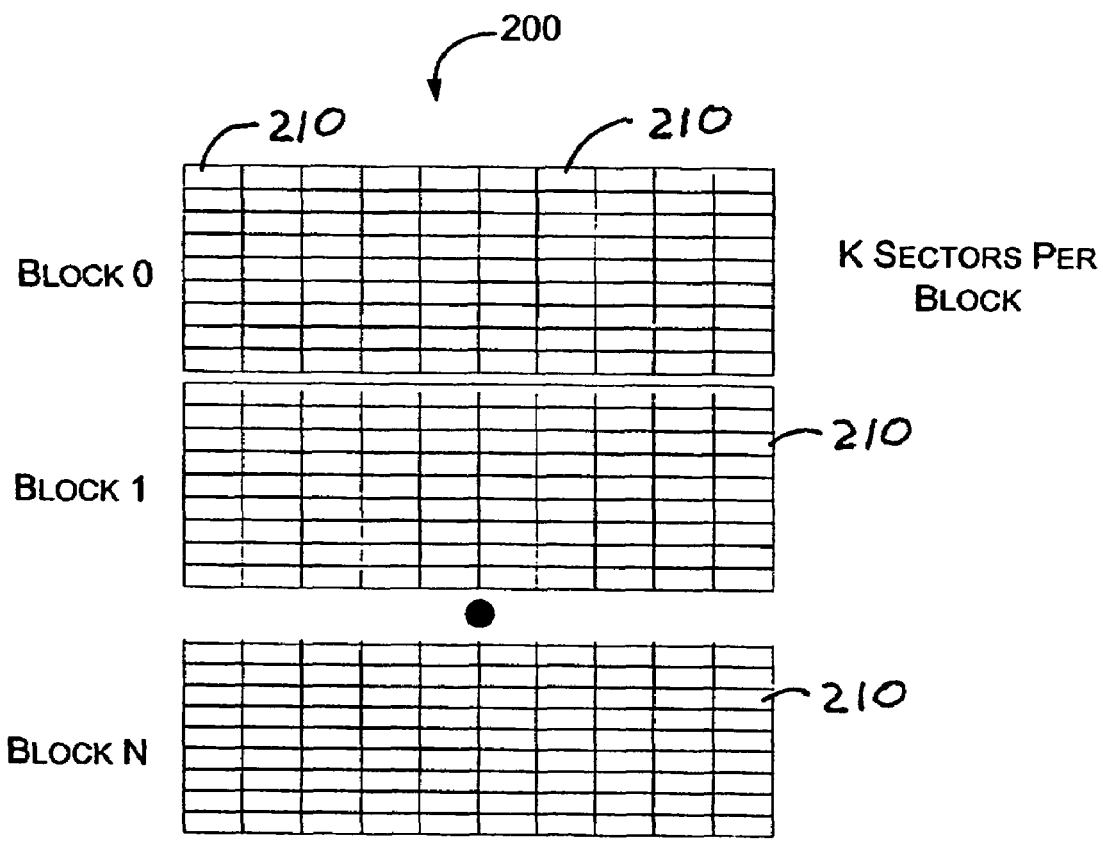
FIG. 2 is a schematic diagram illustrating a NOR flash memory medium.

Referring to the accompanying drawings in which like reference numbers indicate like elements, FIGS. 1 and 2 illustrate two common types of nonvolatile random access memory, NAND and NOR Flash memory media. These two flash memory media are exemplary and other electrically erasable and programmable read-only memories (EEPROMs) may be used.

Universal Flash Medium Operating Characteristics

FIG. 1 and FIG. 2 illustrate logical representations of example NAND and NOR flash memory media 100, 200, respectively. Both media have universal operating characteristics that are common to each, respectively, regardless of the manufacturer. For example referring to FIG. 1, a NAND flash memory medium is generally split into contiguous blocks (0, 1, through N). Blocks vary in size. For example, a block may be as large as 128 K bytes.

Each block, 0, 1, 2, etc., is further subdivided into K sectors 102; standard commercial NAND flash media commonly contain 8, 16, or 32 sectors per block. The amount of blocks and sectors can vary, however, depending on the manufacturer. Some manufacturers refer to "sectors" as "pages." Both terms as used herein are equivalent and interchangeable.

Each sector 102 is further divided into two distinct sections, a data area 103 used to store information and a spare area 104 which is used to store extra information such as error correction code (ECC). The data area 103 size is commonly implemented as 512 bytes, but again could be more or less depending on the manufacturer. At 512 bytes, the flash memory medium allows most file systems to treat the medium as a nonvolatile memory device, such as a fixed disk (hard drive). As used herein RAM refers generally to the random access memory family of memory devices such as DRAM, SRAM, VRAM, VDO, and so forth. Commonly, the size of the spare area 104 is implemented as 16 bytes of extra storage in NAND flash media devices. Again, other sizes, greater or smaller can be selected. In most instances, the spare area 104 is used for error correcting codes, and status information.

A NOR memory medium 200 is different than a NAND memory medium in that blocks are not subdivided into physical sectors, but are subdivided into cells 210. Each cell 210 is one byte in length. Similar to RAM, each byte stored within a block of NOR memory medium is individually addressable.

Aside from the overall layout and operational comparisons, some universal electrical characteristics (also referred to herein as "memory requirements" or "rules") of flash devices can be summarized as follows:

1. Write operations to a sector can change an individual bit from a logical '1' to a logical '0', but not from a logical '0' to logical '1' (except for case No. 2 below);
2. Erasing a block sets all of the bits in the block to a logical '1';
3. It is not generally possible to erase individual sectors/bytes/bits in a block without erasing all sectors/bytes within the same block;
4. Blocks have a limited erase lifetime of between approximately 10,000 to 100,000 cycles;
5. NAND flash memory devices use ECC to safeguard against data corruption due to leakage currents; and
6. Read operations do not count against the write/erase lifetime.

Flash Driver Architecture

Figure 3:
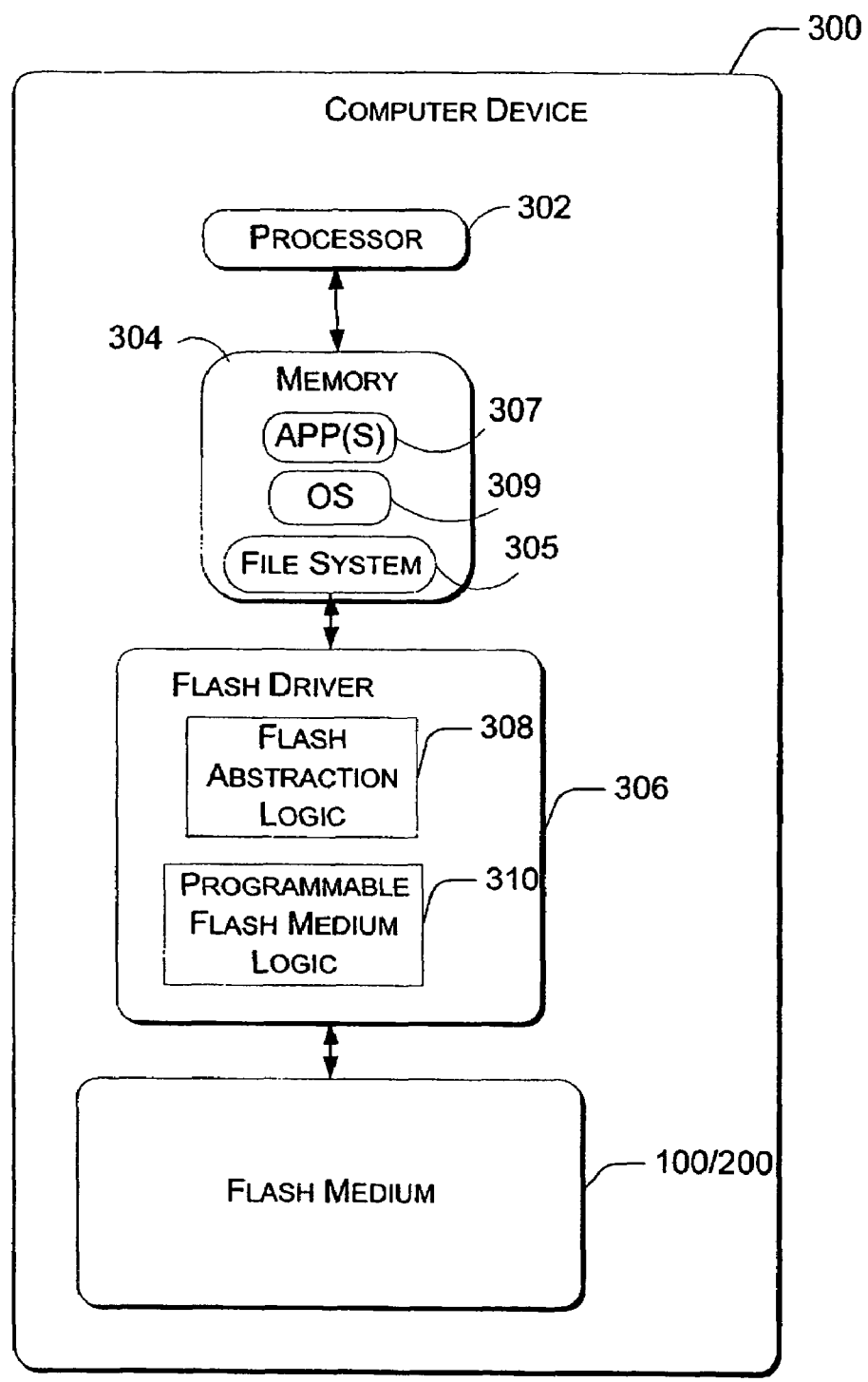
FIG. 3 is a schematic diagram illustrating a computer device having one or more flash memory devices to store data.

FIG. 3 illustrates pertinent components of a computer device 300, which uses one or more flash memory devices to store information. Generally, various different general purpose or special purpose computing system configurations can be used for computer device 300, including but not limited to personal computers, server computers, hand-held or laptop devices, portable communication devices, multiprocessor systems, microprocessor systems, microprocessor-based systems, programmable consumer electronics, gaming systems, multimedia systems, satellite television receivers and decoders, the combination of any of the above example devices and/or systems, and the like.

Computer device 300 generally includes a processor 302, memory 304, and a flash memory media 100/200. The computer device 300 can include more than one of any of the aforementioned elements. Other elements such as power supplies, keyboards, touch pads, I/O interfaces, displays, LEDs, audio generators, vibrating devices, and so forth are not shown, but could easily be a part of the exemplary computer device 300.

Memory 304 generally includes both volatile memory (e.g., RAM) and non-volatile memory (e.g., ROM, PCMCIA cards, etc.). In most implementations described below, memory 304 is used as part of computer device's 300 cache, permitting application data to be accessed quickly without having to permanently store data on a non-volatile memory such as flash medium 100/200.

An operating system 309 is resident in the memory 304 and executes on the processor 302. An example operating system implementation includes the Windows® CE operating system from Microsoft Corporation, but other operation systems can be selected from one of many operating systems, such as DOS, UNIX, LINUX, etc. For purposes of illustration, programs and other executable program components such as the operating system are illustrated herein as discrete blocks, although it is recognized that such programs and components reside at various times in different storage components of the computer, and are executed by the processor(s) of the computer device 300.

One or more application programs 307 are loaded into memory 304 and run on the operating system 309. Examples of applications include, but are not limited to, email programs, word processing programs, spreadsheets programs, Internet browser programs, as so forth.

Also loaded into memory 304 is a file system 305 that also runs on the operating system 309. The file system 305 is generally responsible for managing the storage and retrieval of data to memory devices, such as magnetic hard drives, and also, in this exemplary implementation flash memory media 100/200. Most file systems 305 access and store information at a logical level in accordance with the conventions of the operating system the file system 305 is running. It is possible for the file system 305 to be part of the operating system 309 or embedded as code as a separate logical module.

Flash driver 306 is implemented to function as a direct interface between the file system 305 and flash medium 100/200. Flash driver 306 enables computer device 300 through the file system 305 to control flash medium 100/200 and ultimately send/retrieve data. As shall be described in more detail, however, flash driver 306 is responsible for more than read/write operations. Flash driver 306 is implemented to maintain data integrity, minimize data loss during a power interruption to computer device 300 and permit OEMs of computer devices 300 to support their respective flash memory devices regardless of the manufacturer. The flash driver 306 is file system agnostic. That means that the flash driver 306 supports many different types of files systems, such as File Allocation Data structure File System (FAT16), (FAT32), and other file systems. Additionally, flash driver 306 is flash memory medium agnostic, which likewise means driver 306 supports flash memory devices regardless of the manufacturer of the flash memory device. That is, the flash driver 306 has the ability to read/write/erase data on a flash medium and can support most, if not all, flash devices.

In the exemplary implementation, flash driver 306 resides as a module within operating system 309, that when executed serves as a logical interface module between the file system 305 and flash medium 100/200. The flash driver 306 is illustrated as a separate box 306 for purposes of demonstrating that the flash driver when implemented serves as an interface. Nevertheless, flash driver 306 can reside in other applications, part of the file system 305 or independently as separate code on a computer-readable medium that executes in conjunction with a hardware/firmware device.

In one implementation, flash driver 306 includes: a flash abstraction logic 308 and a programmable flash medium logic 310. Flash abstraction logic 308 and programmable medium logic 310 are coded instructions that support various features performed by the flash driver 306. Although the exemplary implementation is shown to include these two elements, various features from each of the flash abstraction logic 308 and flash medium logic 310 may be selected to carry out some of the more specific implementations described below. So while the described implementation shows two distinct layers of logic 308/310, many of the techniques described below can be implemented without necessarily requiring all or a portion of the features from either layer of logic. Furthermore, the techniques may be implemented without having the exact division of responsibilities as described below, all without departing from the scope of the present invention.

The programmable medium logic 310 includes a programmable entry point module (not shown), I/O module (not shown), and an ECC module (not shown). The programmable entry point module defines a set of programming interfaces to communicate between flash abstraction logic 308 and flash medium 100/200. In other words, the programmable entry points permit manufacturers of computer devices 300 to program the flash media logic 310 to interface with the actual flash memory medium 100/200 used in the computer device 300. The I/O module contains specific code necessary for read/write/erase commands that are sent to the Flash memory medium 100/200. The user can program the ECC module to function in accordance with any particular ECC algorithm selected by the user.

In one implementation, the flash abstraction logic 308 manages those operating characteristics that are universally common to flash memory media. These universal memory requirements include maintaining data integrity and handling recovery of data after a power failure.

Figure 4A:
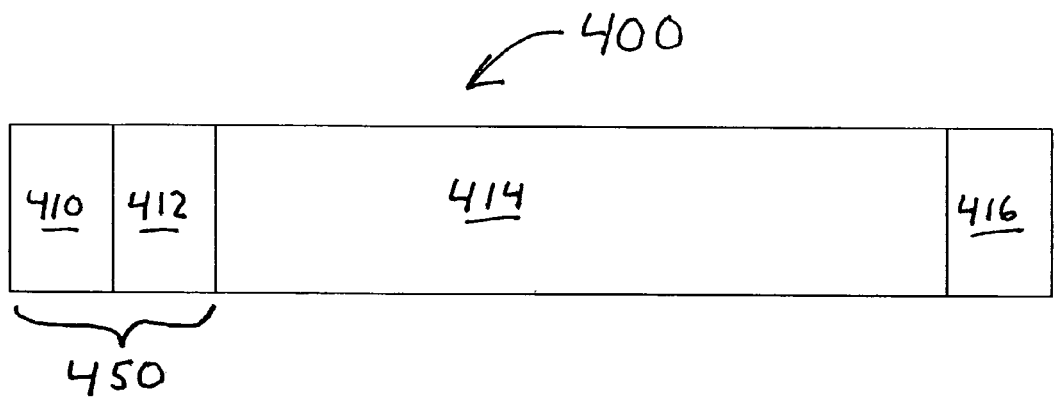
FIG. 4a is a schematic diagram illustrating in general a node header and data record.

FIG. 4a illustrates in general a data record 400 as written in flash medium 100/200. The data record 400 includes a node header 450. In the depicted embodiment, the node header 450 is 16 bit; however, other sizes may be used. For example, the node header 450 may be 24 bit. The node header 450 includes a flag 410 and a pointer 412. In one embodiment, the flag 410 and the pointer are each one byte in length. However, other combinations are possible. For example, the flag may be one bit in length and the pointer 412 could be 15 bits. The node header 450 is generated by the flash abstraction logic 308 as the data record 400 is written to the flash medium 100/200. The data record 400 further includes data 414. The data 414 may be comprised of configuration data, audio data, or video data, for example MPEG encoded data. Optionally, an error checking value 416 may be included. In a NAND embodiment, data area 103 receives node header 450 and data 414. In an optional embodiment, spare area 104 receives the error checking value 416. In a NOR embodiment, the flag 410 and the pointer 412 are each stored in the cells 210. In this last embodiment, the data 414 is broken down into individual bytes and each byte is stored in a cell 210. In such an embodiment, the node header 450 and the data 414 are stored consecutively within the cells 210.

The flag 410 stores information on the flash memory block in which data is stored. For example, if the flag 410 is "FF" in hexadecimal, the block is completely erased and ready to be written. However, if the flag 410 is "7F" in hexadecimal, then the block is at least partially written. Finally, if the flag 410 is "00" in hexadecimal, then all segments or cells have been written, and the block may need to be erased.

In the present invention, the pointer 412 identifies a current valid record. Valid means the most recent record. For example, if the flash medium 100/200 is used to store configuration records, then the valid record is the configuration record that was written last. As an example, the pointer 412 provides the bit length to the next available record. The pointer 412 indicates whether a particular segment or cell has data and whether the data is valid or invalid.

In one embodiment of the invention, data records are written to the flash medium 100/200 in convention much like one records entries into a journal or diary. In other words, the flash medium 100/200 has discrete sections that are consecutively arranged. One of the discrete sections is identified as the current memory page. Data records are written to the current page until that page is full. When the page is full, the next consecutive page is identified as the current memory page. The node header 450 contains information regarding the data record and may contain information regarding the block. Continuing with the analogy, the node header 450 acts like a journal entry date and may include a journal page number.

Figure 4B:
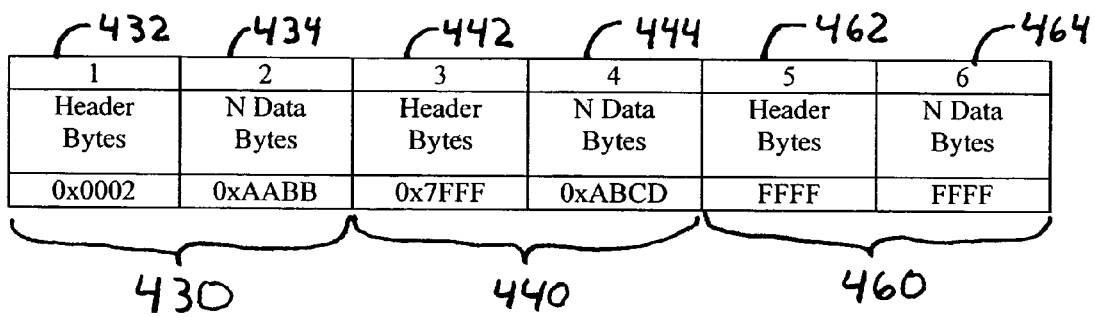
FIG. 4b is a schematic diagram illustrating in general a string of data records.

FIG. 4b further illustrates the analogy. FIG. 4b is a schematic diagram illustrating in general a string of data records as written in flash medium 100/200. In the depicted embodiment, there is a first record 430 having a first header 432 and first data 434. Also depicted in the embodiment of FIG. 4b is a second record 440 having a second header 442 and second data 444. The headers 432,442 are node headers and each includes a flag and a pointer. It is important to note that upon the first initialization of the flash medium 100/200, all blocks are erased. Upon subsequent start-ups, however, the flash medium 100/200 contains data as previously stored, even after system shut down, because flash memory is nonvolatile. Here, the first record 430 and the second record 440 have been written to the flash medium 100/200 and the remainder of the flash medium 100/200 is erased, i.e. all bits are set to a binary "1."

FIG. 4b illustrates the first header 432 having a value of a decimal "2." In other words, the flag is set to zero and the pointer is equal to a decimal "2." This indicates that the next header will follow after two bytes. The first data 434 and the second data 444 contain data, such as a configuration record for example. The first data 434 is two bytes long in the embodiment depicted in FIG. 4b. The second header 440 follows immediately after the first data 434. The second header 440 has a value of "0x7FFF." In other words, the flag is set to "7F" and the bits of the pointer are set to binary "1." This indicates that the following data is valid. In other words, it indicates that the data following the header is the most recent data file. The first data 434 and the second data 444 are variable in length. As an example, second data 444 has a length of 132 bytes. In one embodiment, data 434, 444 include a variable to indicate its overall length. For example, the last byte of the data 434,444 may indicate data length.

Suppose a third record is to be written in the spaced indicated as 460. First, a third header 462 will be written by the processor 302. The third header 462 will be written from "FFFF" to "0x7FFF." This changes the first bit of the flag from a binary "1" to zero. A third data 464 will be written consecutively after the third header. Next, location, or "journal entry," must be given to the third header 462. As such, the second header 442 is rewritten to store the second data length, "132" for example. In this way, the second header 442 indicates the position of the third header 462.

Figure 5:
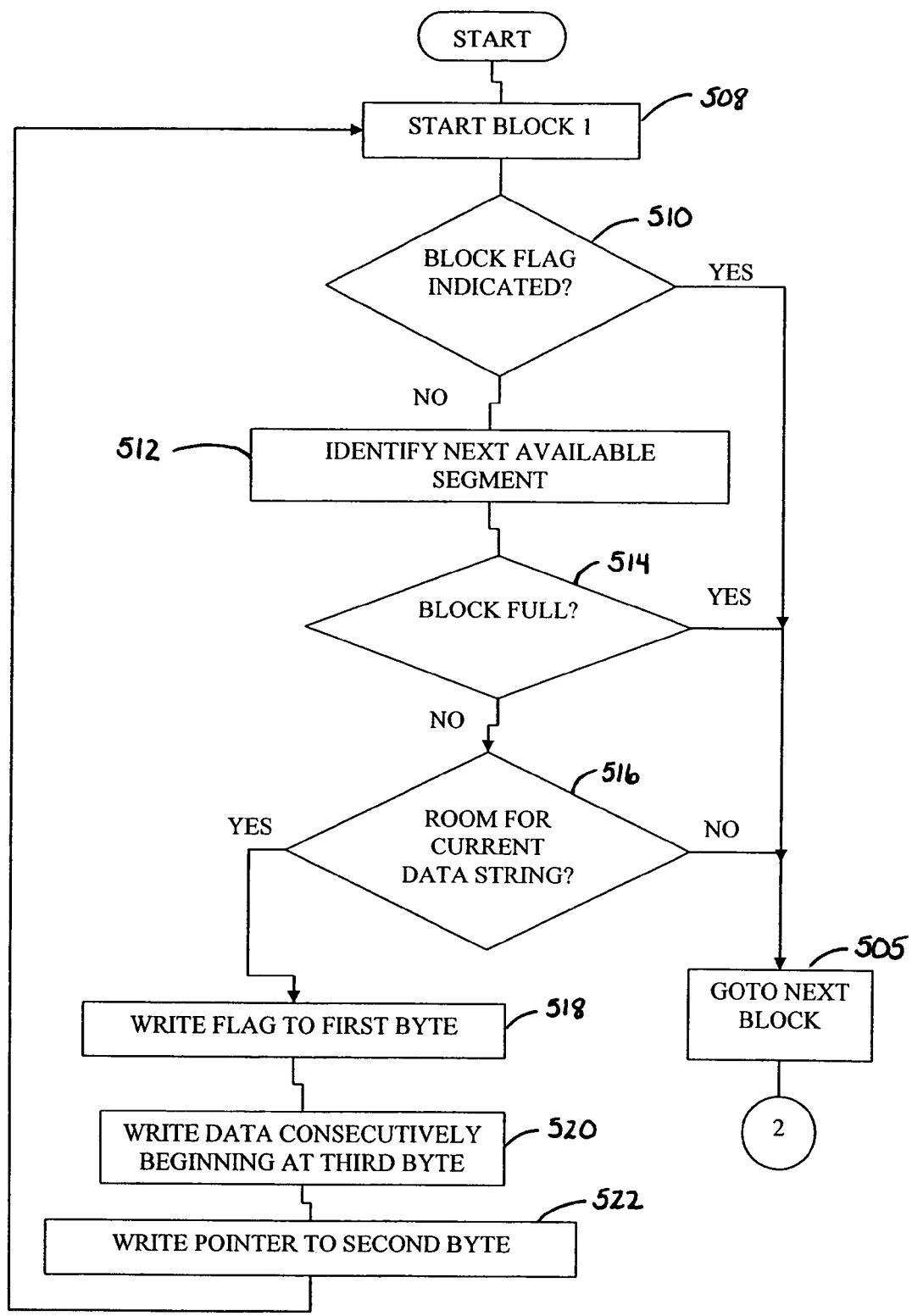
FIG. 5 is a flowchart illustrating logic steps for writing data to a first block.
Figure 6:
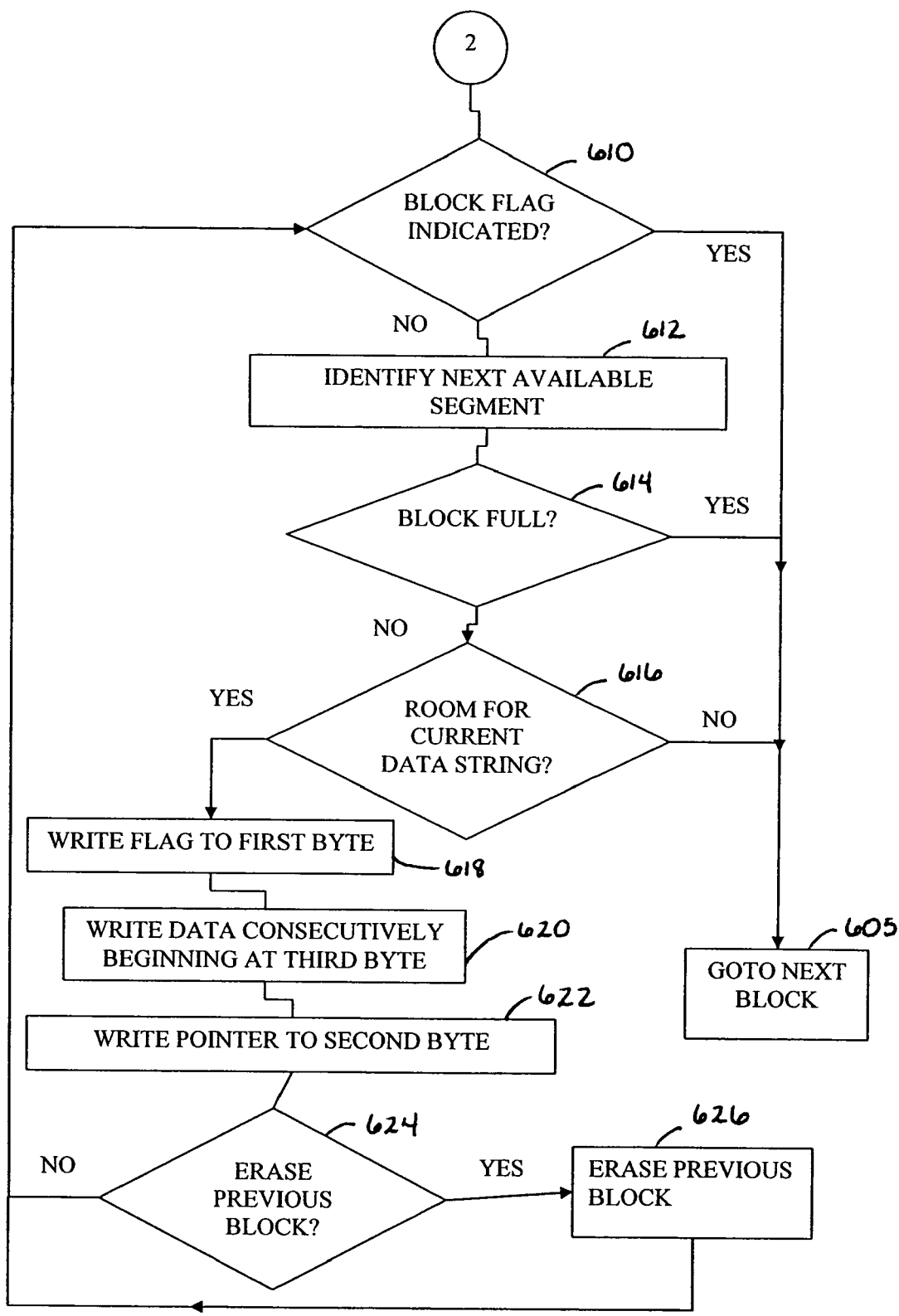
FIG. 6 is a flowchart illustrating logic steps for writing data to a subsequent block.

FIGS. 5 and 6 illustrate a write portion of the flash abstraction logic 308. In a first step 508, the processor 302 has a data string to be written to the flash medium 100/200. For example, there is a data string waiting in queue in the RAM.

The processor 302 begins in the first block of the flash medium 100/200. The processor 302 first checks in step 510 to see whether the block has been flagged, meaning whether it should be skipped. For example, if all of the bits of the first byte are set to a binary "1," then the block contains no data (i.e., it's erased) and the processor 302 can skip the instant block. If so, the processor 302 moves on to the next block in step 505. The processor 302 then identifies the next available record or segment in step 512. In step 514, the processor 302 checks to see if the current block is full. In step 514, the processor 302 "tabs through" the current block by looking at the header of data record. The header provides information on the number of bytes to skip. The processor 302 reads each header and skips the appropriate number of bytes. If the processor 302 "tabs through" the entire length of the current block, then the block is full.

If so, the processor 302 proceeds on to the next block in step 505. In an optional step, the processor may write the first two bytes of the instant block to all zeroes, thereby acting as a flag to indicate the particular block is full. The processor then checks to see if there is sufficient room in the current block to write the data string in step 516. If there is not sufficient room to write the current data string, then the processor 302 moves on to the next block.

If so, then the processor writes the data string to the identified next available segment. The processor 302 generates a header having a flag and a pointer as described above in conjunction with FIGS. 4a and 4b. The processor 302 writes the flag in the first header to a first byte of the next available record in step 518. In step 520, the processor 302 then writes the data string consecutively after the first header, for example beginning at the third byte, until the whole string is written. The processor 302 then writes a pointer in the byte before the preceding data string, for example the second byte of the previous header, in step 522. The pointer provides the length from the first header to a second header. The pointer allows the processor 302 to identify the beginning of a current valid record. Thereafter, the processor is ready to write the next data string in the current block until it is full.

If the block has been flagged, or if the block is full, or if there is insufficient room to write the data string, then the processor moves on to the next block in step 505. For example, if the flash medium 100/200 has two blocks, the processor would stop looking at block 1 and would look in block 2. As shown in FIG. 6, the processor 302 first decides whether the block has been flagged in step 610. If so, the processor 302 proceeds to the next block in step 605. If the block has not been flagged, then the processor 302 identifies the next available record in step 612. In step 614, the processor decides whether the block is full. If so, the processor 302 proceeds to the next block. The processor 302 then decides whether there is sufficient room for the current data string in step 616. If so, the processor 302 writes a flag in a first header to a first byte of the next available record in step 618. The processor 302 then writes the data string consecutively after the header, for example beginning at the third byte, until the whole string is written in step 620. In step 622, the processor 302 then writes a pointer in the byte before the preceding data string, for example the second byte of the previous header. The pointer provides the length from the first header to a second header. The pointer allows the processor 302 to identify the beginning of the valid record. The processor 302 then decides whether the previous block should be erased in step 624. As an example, the previous block may be erased if the header includes an appropriate flag. The previous block is erased in step 626. Thereafter, the processor is ready to write the next data string in the current block until it is full.

Figure 7:
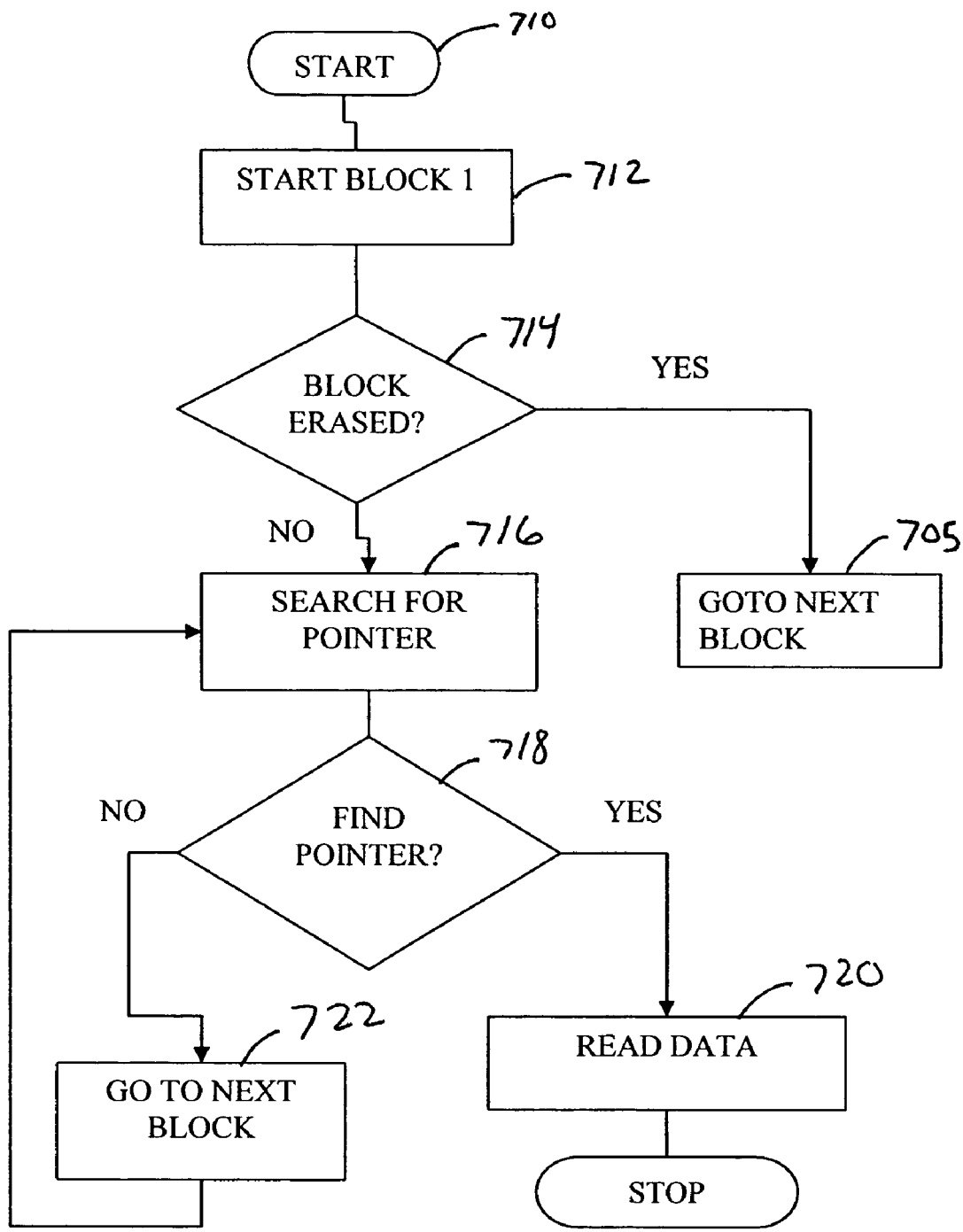
FIG. 7 is a flowchart illustrating logic steps for reading data from a block.

FIG. 7 illustrates a read portion of the flash abstraction logic 308. The processor begins at a first step 710 to locate and read a data string stored in the flash medium 100/200. The processor 302 proceeds to the first block in step 712. In step 714, the processor decides whether the block has been erased. If so, the processor 302 proceeds to the next block in step 705.

The processor 302 searches for the pointer indicating a valid current record in step 716. The processor 302 searches for the valid record by reading each header of the current block. The processor 302 starts in the first header of the first block. For example, if the first header reads "0x7FFF" in hexadecimal, then the data following the header is the valid record. However, if the header indicates some other value, then that value leads to the next data record. The processor 302 then sequentially reads each header to determine which header is adjacent the valid data record.

The processor 302 decides whether the pointer indicating a valid record is found in step 718. If so, the processor 302 reads the data string in step 720. If a pointer is not found in the current block, the processor 302 increments the block number by one in step 722 thereby directing the processor 302 to the next block. The processor 302 then begins the search again and repeats this process until the pointer indicating a valid record is found.

As an example, and referring once again to FIG. 4b, suppose the processor 302 must retrieve the valid record, which is in the depicted embodiment the second data 444. The processor 302 starts at step 710. The processor 302 goes to the first byte of the first block in step 712. The processor 302 inquires whether the block is erased in step 714. Here, the first byte of the first header 432 is not all binary "1," so the processor 302 recognizes that the block is not erased. The processor 302 then searches for the pointer indicating a valid record in step 716. The processor searches by looking at the first header 432. The second byte of the first header 432 has the value "2." This "tells" the processor 302 to skip the next two bytes. So, the processor 302 skips the first data 434. The processor 302 then looks to the second byte of the second header 442, which has a value of "FF." This "tells" the processor 302 that the data following the header contains the valid record. The processor 302 proceeds to step 720 and reads the data.

In view of the foregoing, it will be seen that the several advantages of the invention are achieved and attained.

The embodiments were chosen and described in order to best explain the principles of the invention and its practical application to thereby enable others skilled in the art to best utilize the invention in various embodiments and with various modifications as are suited to the particular use contemplated.

As various modifications could be made in the constructions and methods herein described and illustrated without departing from the scope of the invention, it is intended that all matter contained in the foregoing description or shown in the accompanying drawings shall be interpreted as illustrative rather than limiting. For example, the node header is illustrated as having 16 bits but may have 24 bits. Thus, the breadth and scope of the present invention should not be limited by any of the above-described exemplary embodiments, but should be defined only in accordance with the following claims appended hereto and their equivalents.

What is claimed is:

1. A method of writing a data string to a flash memory having a plurality of erase blocks and having a plurality of records, the records being configured to store data written to them, wherein the data string occupies more than one record, the method comprising:

finding a first block having available records;

determining if a first group of consecutive available records in said first block with available records is large enough to contain the entire data string;

if the first group of consecutive available records is not large enough, then determining if a next group of consecutive available records is large enough to contain the entire data string;

writing the data string continuously to a first group of consecutive available records that is large enough to contain the data string; and identifying said written continuous data string with a first keyless header having a first flag and a first pointer.

2. The method of claim 1 further comprising:

iterating each of said steps for a plurality of data strings until said first block with available records is full; and erasing said full block;

wherein a plurality of said writing and erasing steps minimizes a plurality of write/erase cycles in said flash memory.

3. The method of claim 1 further comprising:

finding a second block having available records;

determining if a second group of consecutive available records in said second block with available records is large enough to contain a second data string;

if the second group of consecutive available records is not large enough, then determining if a next group of consecutive available records is large enough to contain the second data string;

writing the second data string to a second group of consecutive available records that is large enough to contain the second data string; and identifying said second written data string with a second header having a second flag and a second pointer.

4. The method of claim 1 further comprising:

iterating each of said steps for a plurality of data strings until said first block with available records is full.

5. The method of claim 4 further comprising:

iterating said steps until said flash memory is full.

6. The method of claim 5 further comprising:

erasing a first block in said flash memory when said flash memory is full.

7. The method of claim 4 further comprising:

erasing said full block.

8. The method of claim 1 further comprising:

reading the data string by finding said first header and reading consecutive records thereafter.

9. The method of claim 1 wherein said first pointer provides a length from said first header to a next header.

10. The method of claim 1 further comprising:

writing said first flag in said first header to a first byte of a next available record.

11. A processor for writing data strings to flash memories and erasing blocks from flash memories, said flash memories having a plurality of erase blocks and having a plurality of records, the records being configured to store data written to them, wherein the data string occupies more than one record, the apparatus comprising:

a processor being configured to:

find a first block having available records;

determine if a first group of consecutive available records in said first block with available records is large enough to contain the entire data string;

if the first group of consecutive available records is not large enough, then determine if a next group of consecutive available records is large enough to contain the entire data string;

write the data string continuously to a first group of consecutive available records that is large enough to contain the data string; and identify said written continuous data string with a first keyless header having a first flag and a first pointer.

12. The processor of claim 11 further comprising:

said processor being further configured to:

erase said full block;

wherein a plurality of said writing and erasing steps minimizes a plurality of write/erase cycles in said flash memory.

13. The processor of claim 11 further comprising:

said processor being configured to:

find a second block having available records;

determine if a second group of consecutive available records in said second block with available records is large enough to contain a second data string;

if the second group of consecutive available records is not large enough, then determine if a next group of consecutive available records is large enough to contain the second data string;

write the second data string to a second group of consecutive available records that is large enough to contain the second data string; and identifying said written data string with a second header having a second flag and a second pointer.

14. The processor of claim 11 further comprising:

said processor being configured to:

iterate each of said steps for a plurality of data strings until said first block with available records is full.

15. The processor of claim 11 further comprising:

said processor being configured to:

iterate said steps until said flash memory is full.

16. The processor of claim 11 further comprising:

said processor being configured to:

erase said full block.

17. The processor of claim 11 further comprising:

said processor being configured to:

erase a first block in said flash memory when said flash memory is full.

18. The processor of claim 11 further comprising:

said processor being configured to read the data string by finding said first header and reading consecutive records thereafter.

19. The processor of claim 11 wherein said first pointer provides a length from a first header to a next header.

20. The processor of claim 11 further comprising:

said processor being configured to:

write a flag in a first header to a first byte of a next available record.

* * * * *